(12) United States Patent
Hitomi et al.

(10) Patent No.: US 7,151,419 B2
(45) Date of Patent: Dec. 19, 2006

(54) OSCILLATION-STOP DETECTION CIRCUIT, OSCILLATION-STOP DETECTION SYSTEM, ELECTRONIC DEVICE, AND OSCILLATION-STOP DETECTION METHOD

(75) Inventors: Masahiko Hitomi, Saitama (JP); Masashi Shimozuru, Tokyo (JP)

(73) Assignee: Citizen Watch Co., Ltd., Tokyo (JP)

(*) Notice: Subject to any disclaimer, the term of this patent is extended or adjusted under 35 U.S.C. 154(b) by 43 days.

(21) Appl. No.: 11/071,285

(22) Filed: Mar. 4, 2005

(65) Prior Publication Data

US 2005/0195044 A1  Sep. 8, 2005

(30) Foreign Application Priority Data

Mar. 5, 2004  (JP) ............... 2004-063038
Mar. 8, 2004  (JP) ............... 2004-064397

(51) Int. Cl.
  *H03L 1/00*  (2006.01)
  *H03B 5/36*  (2006.01)
(52) U.S. Cl. ...................... 331/186; 331/173
(58) Field of Classification Search ........... 331/173, 331/175, 185, 186
  See application file for complete search history.

(56) References Cited

U.S. PATENT DOCUMENTS

2001/0020876 A1* 9/2001 Tsukagoshi et al. ........ 331/158

FOREIGN PATENT DOCUMENTS

JP   2000-332585 A   11/2000

* cited by examiner

*Primary Examiner*—David Mis
(74) *Attorney, Agent, or Firm*—Foley & Lardner LLP

(57) ABSTRACT

An oscillation-stop detection circuit includes a switching unit that repeats turning on and off based on a cycle of an oscillation signal from an outside; a capacitor that is charged when the switching unit is turned on, and discharged when the switching unit is turned off; a first MOS transistor that flows a discharge current of the capacitor when the capacitor is discharged; a discharge cutoff unit that cuts off a discharge path for the discharge current to flow, for a predetermined time right after a power is turned on; and a detecting unit that detects a status of the oscillation signal based on a voltage of the capacitor.

26 Claims, 11 Drawing Sheets

OSCILLATION-STOP DETECTION CIRCUIT, OSCILLATION-STOP DETECTION SYSTEM, ELECTRONIC DEVICE, AND OSCILLATION-STOP DETECTION METHOD

BACKGROUND OF THE INVENTION

1) Field of the Invention

The present invention relates to a technology for detecting a stop of oscillation of an internal oscillation circuit of an electronic device.

2) Description of the Related Art

Normally, an electronic device including an internal oscillation circuit is provided with an oscillation-stop detection system. As for a clock driven by a battery, for example, a clock integrated-circuit (IC) employs a crystal oscillation circuit. While the crystal oscillation circuit is in an oscillation state, a regulated voltage obtained by dropping a power supply voltage of the clock IC using a regulator is used as a power supply of the crystal oscillation circuit. This is intended to reduce current consumption.

On the other hand, when restarting the crystal oscillation circuit that is in an oscillation stop state, the power supply voltage of the clock IC is used for a prompt and certain start of the oscillation. After restarting the oscillation, the crystal oscillation circuit is driven by the regulated voltage. For this mechanism to work, the oscillation-stop detection system detects a stop of oscillation of the crystal oscillation circuit, and generates a signal necessary to control switching of the power supply for driving the crystal oscillation circuit.

FIG. 11 is a circuit diagram of a configuration of a conventional oscillation detecting circuit. In the oscillation detecting circuit 100 shown in FIG. 11, an N-channel MOS transistor 101 is repeatedly turned on and off based on a potential of an oscillation signal CK supplied from an oscillation circuit (not shown). A capacitor 102 is connected between a high voltage power supply potential VDD and a low voltage power supply potential VSS and charged while the N-channel MOS transistor 101 is turned on. In addition, the capacitor 102 is slightly discharged by a leak current carried across a pull-up resistor 103 while the N-channel MOS transistor 101 is turned off. However, the capacitor 102 is charged again when the N-channel MOS transistor 101 is turned on. By repetition of the charge and discharge, a potential of an input terminal of an inverter 104 is stabilized to the low voltage power supply potential VSS.

Accordingly, while the oscillation signal CK is supplied, a potential of an oscillation-stop detection signal OSCST output from the inverter 104 is at a "high (H)" level at which the potential thereof is relatively high. If the supply of the oscillation signal CK is stopped in this state, the capacitor 102 is then continuously discharged according to a time constant CR and the potential of the input terminal of the inverter 104 starts rising toward the high voltage power supply potential VDD, accordingly. If the potential of the input terminal of the inverter 104 is higher than a threshold of the inverter 104, the potential of the oscillation-stop detection signal OSCST output from the inverter 104 is switched from the "H" level to a "low (L)" level at which the potential thereof is relatively low. In this way, the oscillation detecting circuit 100 detects whether the oscillation circuit oscillates based on the potential of the oscillation-stop detection signal OSCST.

The conventional oscillation detecting circuit requires the pull-up resistor 103 to have a high resistance of about several hundreds of megaohms to about several gigaohms so as to set a discharge time to an appropriate time. However, if such a high resistance is formed within an IC chip, the following problems occur. First, an occupied area of the resistance relative to the IC chip is extremely large, resulting in an increase in a size of the IC chip. Second, because of a large fluctuation in manufacturing process, an absolute accuracy of the resistance is deteriorated. Accordingly, a desired discharge time cannot be obtained and the oscillation detecting circuit cannot often accurately detect whether the oscillation circuit oscillates. Furthermore, the resistance tends to change due to an influence of an external environment such as a light and a temperature. For this reason, for example, when the resistance decreases, a discharge current then increases and the oscillation detecting circuit may possibly erroneously detect that the oscillation of the oscillation circuit is stopped.

Considering these problems, an oscillation detecting circuit 200 configured as shown in FIG. 12 is proposed (see, for example, Japanese Patent Application Laid-open No. 2000-332585 (FIG. 1)). The oscillation detecting circuit 200 includes a constant-current source 201 and a current-mirror circuit as units that discharge the capacitor 102. One P-channel MOS transistor 202 that constitutes the current-mirror circuit is connected to the constant-current source 201 and applies a constant current thereto. The other P-channel MOS transistor 203 that constitutes the current-mirror circuit applies a discharge current proportional to the constant current carried across the one P-channel MOS transistor 202.

In the oscillation detecting circuit 200, similarly to the oscillation detecting circuit 100 configured as shown in FIG. 11, the N-channel MOS transistor 101 is repeatedly turned on and off while the oscillation signal CK is supplied thereto, and the charge and the slight discharge of the capacitor 102 are repeated. In this state, the potential of the input terminal of the inverter 104 is stabilized to the low voltage power supply potential VSS, and the "H" level oscillation-stop detection signal OSCST is output from the inverter 104. When the oscillation is stopped, the capacitor 102 is continuously discharged by the discharge current carried across the other P-channel MOS transistor 203. The potential of the input terminal of the inverter 104 is thereby made higher than the threshold of the inverter 104, and the "L" level oscillation-stop detection signal OSCST is output from the inverter 104.

With the configuration in which the pull-up resistor is used as the unit that discharges the capacitor (see FIG. 11), however, the oscillation detecting circuit requires the pull-up resistor to have a high resistance of about several hundreds of megaohms to about several gigaohms so as to set the discharge time at the appropriate time. If such a high resistance is formed within an IC chip, the two problems described above occur. The oscillation detecting circuit may possibly erroneously detect that the oscillation is stopped.

Furthermore, the circuit disclosed in Japanese Patent Application Laid-open No. 2000-332585 has the following disadvantages. In the clock or the other electronic device, a transient period after the power is turned on before the clock or the other electronic device is turned into a stable state is normally an unstable period in which potentials of the respective units of the circuits, a current carried across the respective units, and the like are unstable. In the unstable period, currents in current amounts different from those in the stable state are carried to the constant-current source and the current-mirror circuit. For example, if the discharge current is excessively carried, the oscillation detecting circuit may perform an unfavorable operation such as an erroneous detection of the oscillation stop although the oscillation is continued.

Moreover, with the configuration in which the constant-current source and the P-channel MOS transistors connected to the capacitor in parallel are used as the capacitor discharging units (see FIG. 12), the oscillation detecting circuit is required to considerably increase ON resistances of the P-channel MOS transistors connected to the capacitor in parallel so as to set the discharge time at the appropriate time. To do so, it is necessary to make a gate length of each P-channel MOS transistor large. This, in turn, disadvantageously increases a gate capacity of each P-channel MOS transistor. Accordingly, an operation of the constant-current source is made slow when the oscillation is started. The electronic device including the oscillation detecting circuit disadvantageously takes a longer time before it is started.

SUMMARY OF THE INVENTION

It is an object of the present invention to solve at least the above problems in the conventional technology.

An oscillation-stop detection circuit according to one aspect of the present invention includes a switching unit that repeats turning on and off based on a cycle of an oscillation signal from an outside; a capacitor that is charged when the switching unit is turned on, and discharged when the switching unit is turned off; a first MOS transistor that flows a discharge current of the capacitor when the capacitor is discharged; a discharge cutoff unit that cuts off a discharge path for the discharge current to flow, for a predetermined time right after a power is turned on; and a detecting unit that detects a status of the oscillation signal based on a voltage of the capacitor.

An oscillation-stop detection system according to another aspect of the present invention includes an oscillation-stop detection circuit that includes a switching unit that repeats turning on and off based on a cycle of an oscillation signal from an outside, a capacitor that is charged when the switching unit is turned on, and discharged when the switching unit is turned off, a first MOS transistor that flows a discharge current of the capacitor when the capacitor is discharged, a discharge cutoff unit that cuts off a discharge path for the discharge current to flow, for a predetermined time right after a power is turned on, and a detecting unit that detects a status of the oscillation signal based on a voltage of the capacitor; and a constant-voltage source that applies a gate bias of a constant potential to a gate of the first MOS transistor.

An oscillation-stop detection system according to still another aspect of the present invention includes an oscillation-stop detection circuit that includes a switching unit that repeats turning on and off based on a cycle of an oscillation signal from an outside, a capacitor that is charged when the switching unit is turned on, and discharged when the switching unit is turned off, a MOS transistor that flows a discharge current of the capacitor when the capacitor is discharged, and a detecting unit that detects a status of the oscillation signal based on a voltage of the capacitor; and a constant-voltage source that applies a gate bias of a constant potential to a gate of the MOS transistor.

An electronic device according to still another aspect of the present invention includes an oscillation circuit that outputs an oscillation signal; an oscillation-stop detection circuit that detects a status of the oscillation, and that outputs an oscillation-stop detection signal upon detecting that the oscillation is stopped; a regulator that drops a power supply potential to output a regulated voltage having a constant potential; and a switching unit that switches a voltage applied to the oscillation circuit between the regulated voltage and the power supply voltage, based on the oscillation-stop detection signal.

An electronic device according to still another aspect of the present invention includes an oscillation circuit that outputs an oscillation signal; an oscillation-stop detection circuit that includes a first switching unit that repeats turning on and off based on a cycle of the oscillation signal, a capacitor that is charged when the first switching unit is turned on, and discharged when the first switching unit is turned off, a first MOS transistor that flows a discharge current of the capacitor when the capacitor is discharged, a second MOS transistor that cuts off a discharge path for the discharge current to flow, for a predetermined time right after a power is turned on, and a detecting unit that detects a status of the oscillation signal based on a voltage of the capacitor; a regulator that includes a reference circuit that generates a predetermined reference potential based on a power supply voltage, a potential generating circuit that generates a positive predetermined potential, and an operational amplifier that includes a negative input terminal to which the reference potential from the reference circuit is input, a positive input terminal to which the positive predetermined potential is input, and an output terminal from which a regulated potential is output, the regulator applying the positive predetermined potential to a gate of the first MOS transistor and the reference potential to a gate of the second MOS transistor; and a second switching unit that switches a voltage applied to the oscillation circuit between the regulated voltage and the power supply voltage based on the oscillation-stop detection signal.

An oscillation-stop detection method according to still another aspect of the present invention includes cutting off a discharge path for a discharge current to flow when a capacitor is discharged, for a predetermined time right after a power is turned on; charging the capacitor based on a cycle of an oscillation signal; discharging an electric charge of the capacitor at a constant current amount; and detecting a status of the oscillation signal based on a voltage of the capacitor.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 5 is a timing chart for explaining operations of the oscillation-stop detection system shown in FIG. 4, when the power is turned on;

FIG. 6 is another timing chart for explaining operations of the oscillation-stop detection system shown in FIG. 4, when the power is turned on;

DETAILED DESCRIPTION

Exemplary embodiments of the present invention will be explained in detail with reference to the accompanying drawings.

Figure 1:
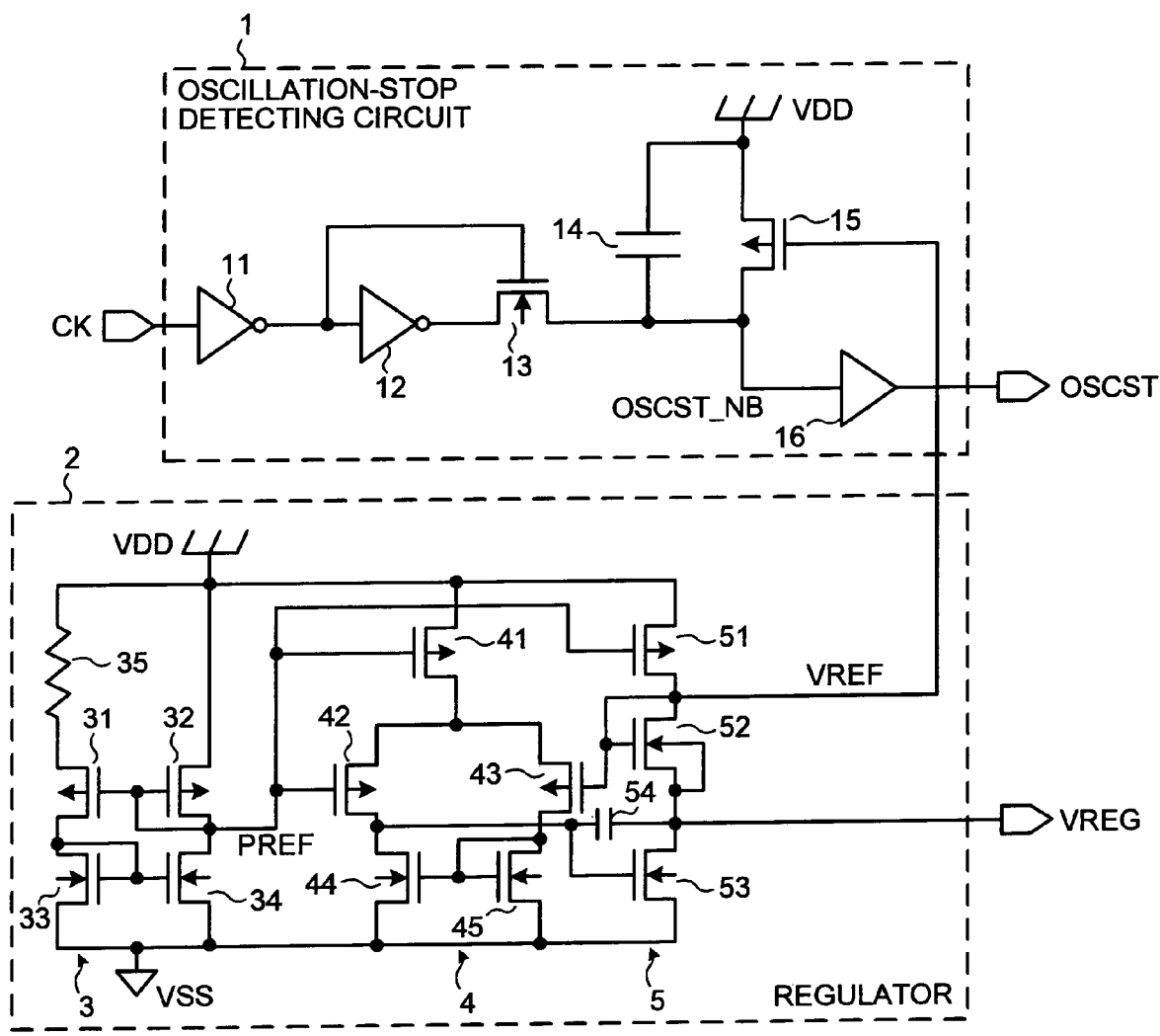
FIG. 1 is a circuit diagram of a configuration of an oscillation-stop detection system according to a first embodiment of the present invention.

FIG. 1 is a circuit diagram of a configuration of an oscillation-stop detection system according to a first embodiment of the present invention. As shown in FIG. 1, the oscillation-stop detection system includes an oscillation-stop detection circuit 1 and a regulator 2 that constitutes a constant-current source. The oscillation-stop detection circuit 1 includes, for example, two inverters 11 and 12, a first N-channel MOS transistor 13 that constitutes a switching unit, a first capacitor 14 that constitutes a capacitor, a first P-channel MOS transistor 15, and a buffer 16 that constitutes a detecting unit.

The first inverter 11 inputs an oscillation signal CK supplied from an external oscillation circuit or the like (not shown), and outputs an inverted signal of the oscillation signal CK. The second inverter 12 inputs a signal output from the first inverter 11 and outputs an inverted signal of the output signal of the first inverter 11. A source terminal of the first N-channel MOS transistor 13 is connected to an output terminal of the second inverter 12. A gate terminal of the first N-channel MOS transistor 13 is connected to an output terminal of the first inverter 11. The first N-channel MOS transistor 13 is, therefore, repeatedly turned on and off per half cycle of the oscillation signal CK.

A drain terminal of the first N-channel MOS transistor 13 is connected to one electrode (hereinafter, "low voltage electrode") of the first capacitor 14, a drain terminal of the first P-channel MOS transistor 15, and an input terminal of the buffer 16. A high voltage power supply potential VDD is applied to the other electrode of the first capacitor 14 and a source terminal of the first P-channel MOS transistor 15. The first capacitor 14 is charged while the first N-channel MOS transistor 13 is turned on, and discharged while the first N-channel MOS transistor 13 is turned off.

A gate bias potential VREF that is a constant potential supplied from the regulator 2 is applied to a gate terminal of the first N-channel MOS transistor 15. Accordingly, the first P-channel MOS transistor 15 operates as the constant-current source that carries a discharge current for the first capacitor 14 when the first capacitor 14 is in a discharged state. The gate bias potential VREF is a potential so as to suppress the discharge current to be a low and constant current. The buffer 16 outputs an oscillation-stop detection signal OSCST based on a potential of a signal input to the buffer 16 (hereinafter, "buffer input signal OSCST_NB"), i.e., a potential of the low voltage electrode of the first capacitor 14.

The regulator 2 includes a reference circuit 3, an operational amplifier 4, and an output stage 5. The reference circuit 3 includes two P-channel MOS transistors (second and third P-channel MOS transistors) 31 and 32, two N-channel MOS transistors (second and third N-channel MOS transistors) 33 and 34, and a resistance element 35. A high voltage power supply potential VDD is applied to one end of the resistance element 35 and a source terminal of the third P-channel MOS transistor 32. The other end of the resistance element 35 is connected to a source terminal of the second P-channel MOS transistor 31. A gate terminal of the second P-channel MOS transistor 31 is connected to a gate terminal and a drain terminal of the third P-channel MOS transistor 32, and to a drain terminal of the third N-channel MOS transistor 34.

A drain terminal of the second P-channel MOS transistor 31 is connected to a drain terminal and a gate terminal of the second N-channel MOS transistor 33, and to a gate terminal of the third N-channel MOS transistor 34. The low voltage power supply potential VSS is applied to a source terminal of the second N-channel MOS transistor 33 and a source terminal of the third N-channel MOS transistor 34. A reference potential PREF is output from the drain terminal of the third P-channel MOS transistor 32. The reference potential PREF is a potential dropped from the high voltage power supply potential VDD by as much as a potential difference between the high voltage power supply potential VDD and a threshold of the P-channel MOS transistor.

The operational amplifier 4 includes three P-channel MOS transistors (fourth, fifth, and sixth P-channel MOS transistors) 41, 42, and 43 and two N-channel MOS transistors (fourth and fifth N-channel MOS transistors) 44 and 45. The high voltage power supply potential VDD is applied to a source terminal of the fourth P-channel MOS transistor 41 serving as a current limiting transistor. The reference potential PREF output from the reference circuit 3 is applied to a gate terminal of the fourth P-channel MOS transistor 41. A drain terminal of the fourth P-channel MOS transistor 41 is connected to a source terminal of the fifth P-channel MOS transistor 42 and a source terminal of the sixth P-channel MOS transistor 43. The reference potential PREF is applied to a gate terminal of the fifth P-channel MOS transistor 42.

A drain terminal of the fifth P-channel MOS transistor 42 is connected to a drain terminal of the fourth N-channel MOS transistor 44. A gate terminal of the fourth N-channel MOS transistor 44 is connected to a drain terminal of the sixth P-channel MOS transistor 43 and to a drain terminal and a gate terminal of the fifth N-channel MOS transistor 45. The low voltage power supply potential VSS is applied to the source terminal of the fourth N-channel MOS transistor 44 and a source terminal of the fifth N-channel MOS transistor 45. A potential (VREF) dropped from the high voltage power supply potential VDD by as much as the potential difference between the low voltage power supply potential VSS and a threshold of the N-channel MOS transistor is applied to a gate terminal of the sixth P-channel MOS transistor 43 from a sixth N-channel MOS transistor 52 of the output stage 5 to be explained next.

The output stage 5 includes a seventh P-channel MOS transistor 51 serving as a pull-up transistor, the sixth N-channel transistor 52 that constitutes a potential generating circuit, a seventh N-channel MOS transistor 53 that constitutes an actuator, and a second capacitor 54 serving as a phase compensation capacitor. The high voltage power supply potential VDD is applied to a source terminal of the seventh P-channel MOS transistor 51. A reference potential PREF is applied to a gate terminal of the seventh P-channel MOS transistor 51.

A drain terminal of the seventh P-channel MOS transistor 51 is connected to a drain terminal and a gate terminal of the sixth N-channel MOS transistor 52, and to the gate terminal of the sixth P-channel MOS transistor 43 of the operational amplifier 4. The gate bias potential VREF of the first P-channel MOS transistor 15 of the oscillation-stop detection circuit 1 is output from the drain terminal of the sixth N-channel MOS transistor 52. The gate bias potential VREF is a potential dropped from the high voltage power supply potential VDD by as much as the potential difference between the low voltage power supply potential VSS and the threshold of the N-channel MOS transistor.

A source terminal and a bulk of the sixth N-channel MOS transistor 52 are connected to the drain terminal of the seventh P-channel MOS transistor 51. The gate terminal of the seventh P-channel MOS transistor 51 is connected to the drain terminal of the fifth P-channel MOS transistor 42 of the operational amplifier 4. The low voltage power supply potential VSS is applied to the source terminal of the seventh N-channel MOS transistor 53. The second capacitor 54 is connected between the drain terminal and the gate terminal of the seventh N-channel MOS transistor 53. A regulated potential VREG is output from the drain terminal of the seventh N-channel MOS transistor 53.

In the regulator 2 configured as explained above, the reference potential PREF, that is, the potential dropped from the high voltage power supply potential VDD by as much as the potential difference between the high voltage power supply potential VDD and the threshold of the P-channel MOS transistor is applied to a negative input terminal of the operational amplifier 4. In addition, the potential dropped from the high voltage power supply potential VDD by as much as the potential difference between the low voltage power supply potential VSS and the threshold of the N-channel MOS transistor is applied to a positive input terminal of the operational amplifier 4. Accordingly, the operational amplifier 4 operates to keep the regulated potential VREG to a potential obtained by adding the two potentials input to the both input terminals of the operational amplifier 4, i.e., by adding the potential difference between the high voltage power supply potential VDD and the threshold of the P-channel MOS transistor and the potential difference between the low voltage power supply potential VSS and the threshold of the N-channel MOS transistor to a negative side relative to the high voltage power supply potential VDD. This operation is a regulator operation.

Figure 2:
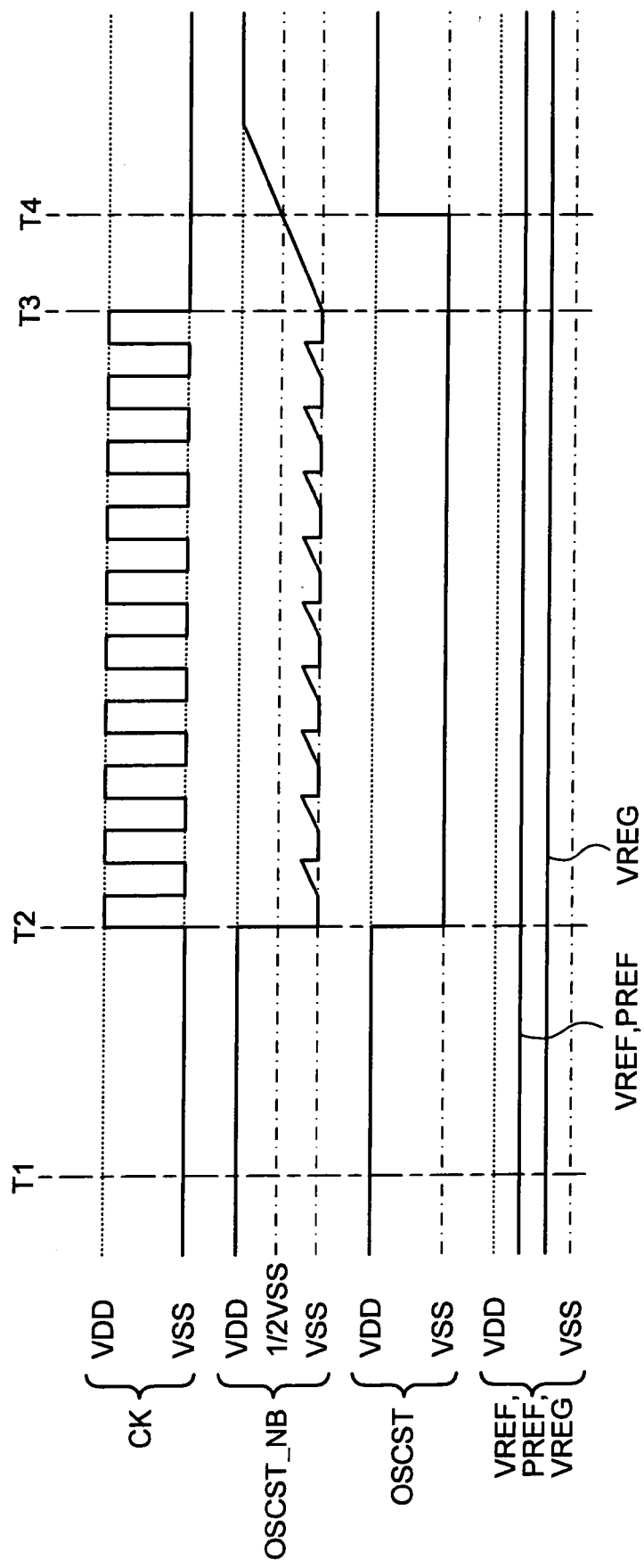
FIG. 2 is a timing chart for explaining operations of the oscillation-stop detection system shown in FIG. 1.

Operations performed by the oscillation-stop detection system configured as shown in FIG. 1 will be explained next. FIG. 2 is a timing chart for explaining the operations. As shown in FIG. 2, it is assumed as follows. At a time T1, the oscillation signal CK is stopped while the first N-channel MOS transistor 13 is turned off. At a time T2, an oscillation is started. At a time T3, the oscillation signal CK is stopped while the first N-channel MOS transistor 13 is turned off. At a time T4, the oscillation-stop detection circuit 1 detects that the oscillation is stopped. The operations at the respective times will be explained. It is assumed herein that the oscillation signal CK has the low voltage power supply potential VSS although the oscillation signal CK is not constant when the oscillation is stopped.

In a period from the time T1 to the time T2, the first capacitor 14 of the oscillation-stop detection circuit 1 is completely discharged. Therefore, the potential of the low voltage electrode of the first capacitor 14, i.e., the potential of the buffer input signal OSCST_NB is equal to the high voltage power supply potential VDD. The potential of the oscillation-stop detection signal OSCST is equal to the high voltage power supply potential VDD, accordingly. The reference potential PREF, the gate bias potential VREF, and the regulated potential VREG are constant whether the oscillation circuit oscillates. In addition, the regulated potential VREG is a potential obtained by adding up the reference potential PREF and the gate bias potential VREF.

At the time T2, the oscillation is started, whereby the first N-channel MOS transistor 13 of the oscillation-stop detection circuit 1 is turned on. Accordingly, the low voltage power supply potential VSS is applied to the low voltage electrode of the first capacitor 14 and the first capacitor 14 starts to be charged. When the first capacitor 14 is sufficiently charged, the potential of the low voltage electrode of the first capacitor 14, i.e., the potential of the buffer input signal OSCST_NB is equal to the low voltage power supply potential VSS. The potential of the oscillation-stop detection signal OSCST is, therefore, equal to the low voltage power supply potential VSS.

In a period from the time T2 to the time T3, the first N-channel MOS transistor 13 is repeatedly turned on and off according to a change in the potential of the oscillation signal CK. While the first N-channel MOS transistor 13 is turned off, the electric charge accumulated in the first capacitor 14 is carried across the first P-channel MOS transistor 15 as the discharge current. Namely, the first capacity 14 starts to be discharged and the potential of the low voltage electrode of the first capacitor 14 starts to rise toward the high voltage power supply potential VDD. As explained above, the discharge current carried at this time is low and constant current.

Accordingly, before the potential of the low voltage electrode of the first capacitor 14 (the potential of the buffer input signal OSCST_NB) reaches a threshold of the buffer 16, the potential of the oscillation signal CK is inverted, the first N-channel MOS transistor 13 is turned on, and the first capacitor 14 is charged again. In the period from the time T2 to the time T3, therefore, the first capacitor 14 is always in a state in which the first capacitor 14 is sufficiently charged, and the potential of the oscillation-stop detection signal OSCST is equal to the low voltage power supply potential VSS. That is, while the oscillation is continued, the oscillation-stop detection circuit 1 outputs the "L" level oscillation-stop detection signal OSCST.

When the oscillation is stopped at the time T3, the discharge current is carried across the first P-channel MOS transistor 15 and the first capacitor 14 starts to be discharged. Accordingly, the potential of the low voltage electrode of the first capacitor 14 starts to rise toward the high voltage power supply potential VDD. Since the oscillation is stopped, the discharge current is continuously carried, so that the potential of the low voltage electrode of the first capacitor 14 continues to rise toward the high voltage power supply potential VDD. At the time T4, when the potential of the low voltage electrode of the first capacitor 14 exceeds the threshold of the buffer 16 (which is ½ VSS in FIG. 2), the potential of the oscillation-stop detection signal OSCST output from the buffer 16 is inverted and turns "H" level. At this moment, the oscillation-stop detection circuit 1 detects that the oscillation is stopped.

If the oscillation is not resumed, the potential of the low voltage electrode of the first capacitor 14 continues to rise and eventually reaches the high voltage power supply potential VDD, and the first capacitor 14 is completely discharged. Accordingly, while the oscillation is stopped, the oscillation-stop detection circuit 1 outputs the "H" level oscillation-stop detection signal OSCST. In order to prevent the oscillation-stop detection circuit 1 from erroneously detecting that the oscillation is stopped in the period in which the oscillation is continued, it is necessary to control the gate bias potential VREF to be low and to suppress the discharge current to be low so that a time from a point (time T3) at which the oscillation is stopped to a point (time T4) at which the potential of the oscillation-stop detection signal OSCST is switched to the "H" level, i.e., an oscillation stop detection time is sufficiently longer than a cycle of the oscillation signal CK.

If the electronic device including the oscillation-stop detection system thus configured is the clock, though not limited thereto, the oscillation-stop detection system can be configured as follows. As the oscillation signal CK, a signal obtained by dividing a frequency of an output signal of a crystal oscillation circuit employed in the clock IC can be normally used. As the regulator 2, a regulator included in the clock can be normally used.

Furthermore, the oscillation-stop detection system can be constituted so that the high voltage power supply potential VDD is set at 0 volt, the low voltage power supply potential VSS is set at −1.5 volts, and the oscillation-stop detection system operates at a negative power supply voltage. In addition, the threshold of the P-channel MOS transistor can be set at −0.4 volt and that of the N-channel MOS transistor can be set at −1.1 volts. If so setting, the potential difference between the high voltage power supply potential VDD and the threshold of the P-channel MOS transistor is 0.4 volt, and that between the low voltage power supply potential VSS and the threshold of the P-channel MOS transistor is also 0.4 volt. The regulator 2, therefore, outputs the regulated voltage VREG of −0.8 volt.

An example of sizes of relevant elements of the oscillation-stop detection system, though not limited thereto, will be explained. A capacity of the first capacitor 14 is about 10 picofarads. The first P-channel MOS transistor 15 has a gate width of about 4 micrometers and a gate length of about 198 micrometers.

Figure 3:
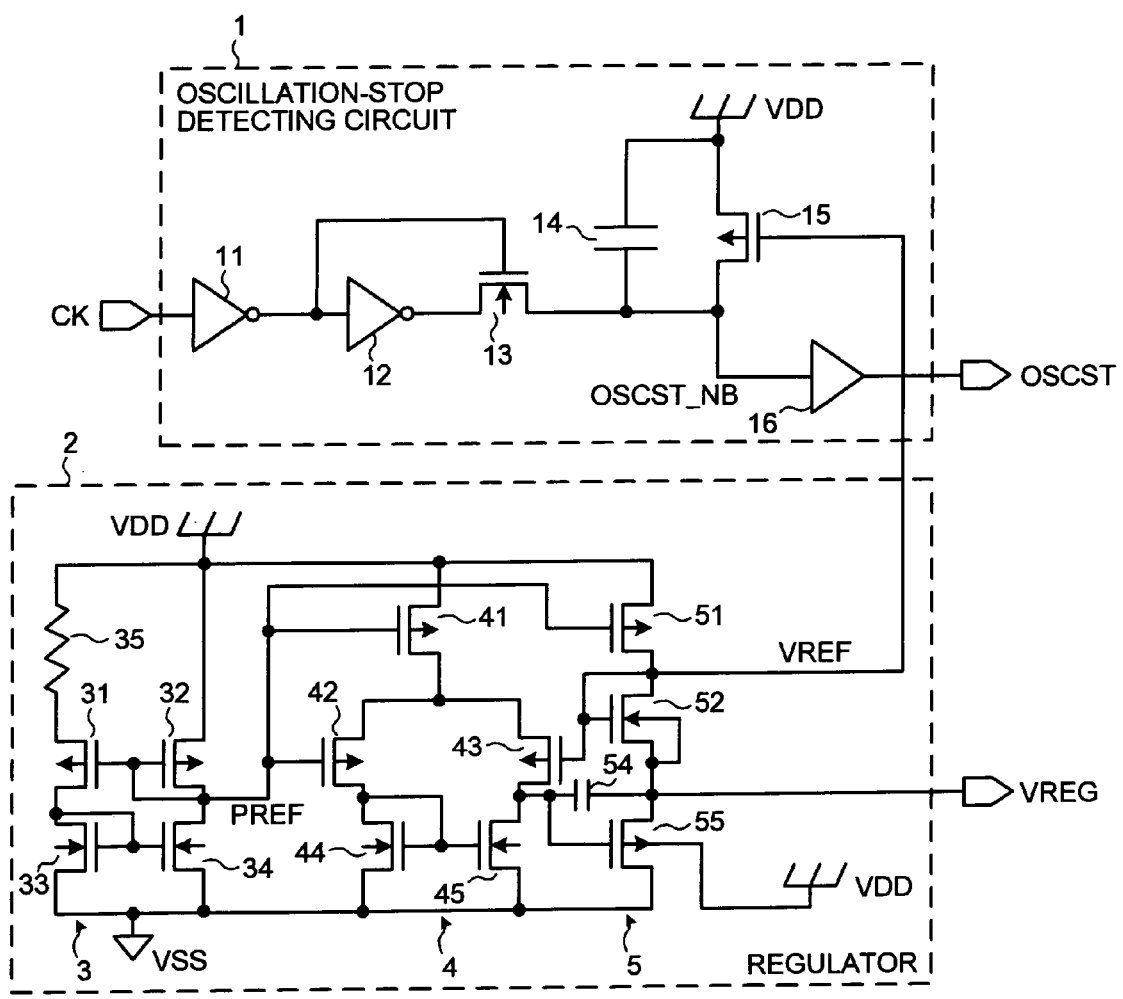
FIG. 3 is a circuit diagram of a modification of the first embodiment.

As shown in a modification of the first embodiment in FIG. 3, an eighth P-channel MOS transistor 55 may be employed as a source follower in the actuator of the output stage 5 of the regulator 2. If so, a gate terminal of the eighth P-channel MOS transistor 55 is connected to the drain terminal of the sixth P-channel MOS transistor 43 and one of the electrodes of the phase compensation second capacitor 54. A source terminal of the eighth P-channel MOS transistor 55 is connected to an output terminal of the regulated potential VREG, to the source terminal of the sixth N-channel MOS transistor 52, and to the other electrode of the second capacitor 54. The low voltage power supply potential VSS and the high voltage power supply potential VDD are applied to a drain terminal and a bulk of the eighth P-channel MOS transistor 55, respectively. Furthermore, the gate terminal of the fourth N-channel MOS transistor 44 is connected to the drain terminal of the fourth N-channel MOS transistor 44, the drain terminal of the fifth P-channel MOS transistor 42, and to the gate terminal of the fifth N-channel MOS transistor 45.

With the configuration shown in FIG. 3, in the eighth P-channel MOS transistor 55, a parasitic capacitance is generated between the gate and the bulk thereof. Therefore, even if the low voltage power supply potential VSS changes, the change is absorbed by the drain of the eighth P-channel MOS transistor 55. Accordingly, the regulated potential VREG is output from the output terminal of the regulated potential VREG without any influence of a change in the low voltage power supply potential VSS. Namely, it is possible to prevent the regulated potential VREG from changing. As long as the regulated potential VREG is constant, the gate bias potential VREF does not change, so that the stable gate bias potential VREF can be achieved. In other words, the stable oscillation stop detection time can be achieved.

According to the first embodiment, while the oscillation is continued, the "L" level oscillation-stop detection signal OSCST is output from the oscillation-stop detection circuit 1. If the oscillation is stopped for the time longer than the predetermined oscillation stop detection time, the "H" level oscillation-stop detection signal OSCST is output from the oscillation-stop detection circuit 1. The oscillation-stop detection system can, therefore, accurately detect that the oscillation of the oscillation circuit is stopped.

Figure 4:
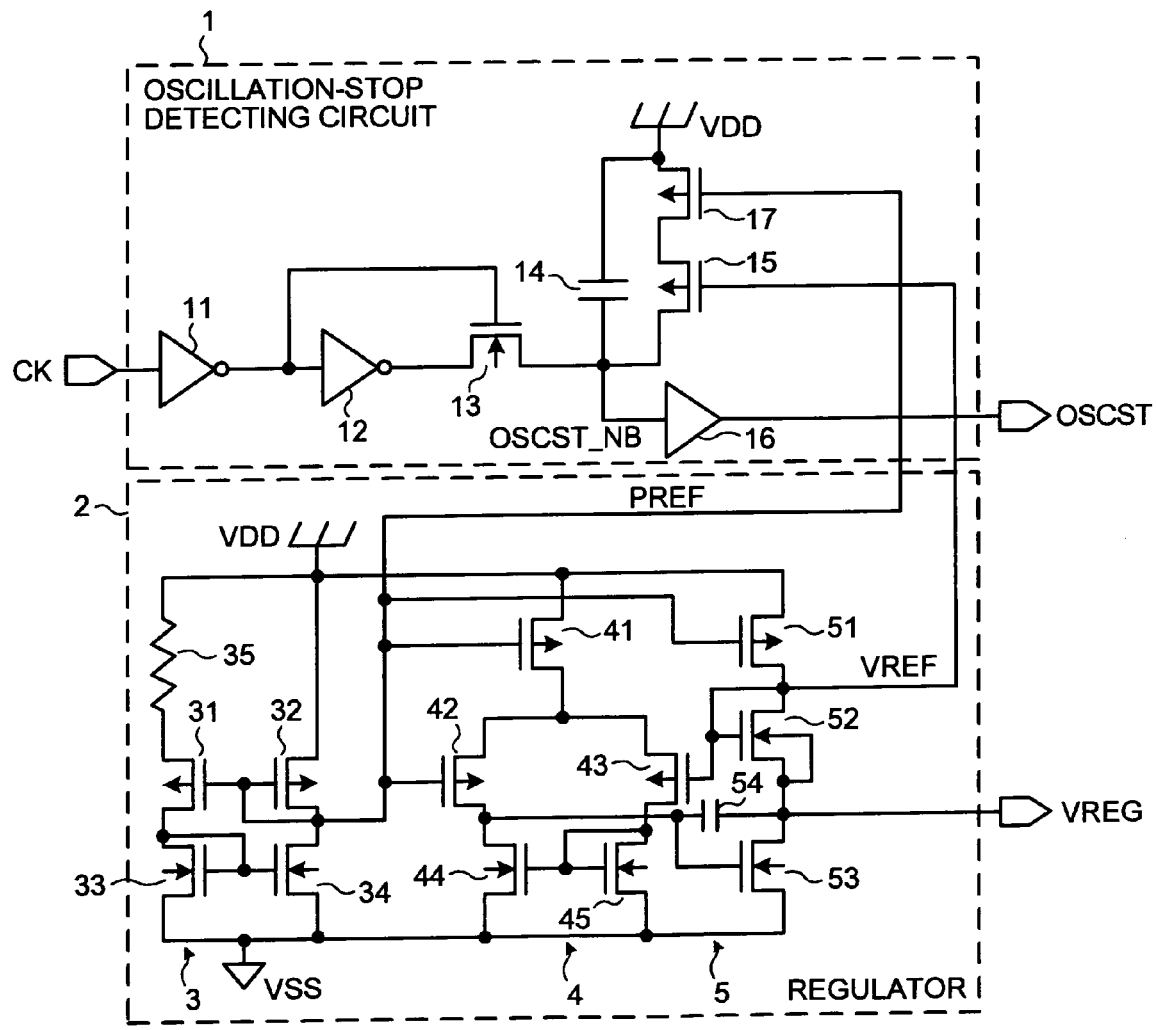
FIG. 4 is a circuit diagram of a configuration of an oscillation-stop detection system according to a second embodiment of the present invention.

FIG. 4 is a circuit diagram of a configuration of the oscillation-stop detection system according to a second embodiment of the present invention. As shown in FIG. 4, the oscillation-stop detection system includes an oscillation-stop detection circuit 1 and a regulator 2 that constitutes a constant-current source. The oscillation-stop detection circuit 1 includes, for example, two inverters 11 and 12, the first N-channel MOS transistor 13 that constitutes the switching unit, the first capacitor 14 that constitutes the capacitor, the first P-channel MOS transistor 15 that serves as a discharge path, the buffer 16 that constitutes the detecting unit, and a ninth P-channel MOS transistor 17 that constitutes a discharge cutoff unit.

A drain terminal of the first N-channel MOS transistor 13 is connected to one electrode (hereinafter, "low voltage electrode") of the first capacitor 14, a drain terminal of the first P-channel MOS transistor 15, and an input terminal of the buffer 16. The high voltage power supply potential VDD is applied to the other electrode of the first capacitor 14 and a source terminal of the first P-channel MOS transistor 15. A drain terminal of the ninth P-channel MOS transistor 17 is connected to a source terminal of the first P-channel MOS transistor 15. The first capacitor 14 is charged when the first N-channel MOS transistor 13 is turned on, and discharged when the first N-channel MOS transistor 13 is turned off.

The gate bias potential VREF that is a constant potential supplied from the regulator 2 is applied to a gate terminal of the ninth P-channel MOS transistor 17. The reference potential PREF is set at a potential for turning off the ninth P-channel MOS transistor 17 while the potentials and currents of the respective units are unstable right after the power is turned on. In addition, the reference potential PREF is set at a potential for turning on the ninth P-channel MOS transistor 17 in a stable state in which the potentials and the currents of the respective units are stable. Accordingly, the ninth P-channel MOS transistor 17 is turned off to cut off the discharge path when the gate bias of the first P-channel MOS transistor 15 is unstable, and turned on when the gate bias thereof is stable.

The gate bias potential VREF that is the constant potential supplied from the regulator 2 is applied to a gate terminal of the first P-channel MOS transistor 15. Accordingly, the first P-channel MOS transistor 15 operates as the constant-current source that carries a discharge current for the first capacitor 14 when the first capacitor 14 is in a discharged state. The gate bias potential VREF is set at a potential so as to suppress this discharge current to have a low constant current amount. The buffer 16 outputs the oscillation-stop detection signal OSCST based on a potential of a signal input to the buffer 16 (hereinafter, "buffer input signal OSCST_NB"), i.e., a potential of the low voltage electrode of the first capacitor 14.

A ratio of a gate width to a gate length of the ninth P-channel MOS transistor 17 is sufficiently higher than that of the first P-channel MOS transistor 15. In other words, an ON resistance of the ninth P-channel MOS transistor 17 is sufficiently lower than that of the first P-channel MOS transistor 15. In the stable state, therefore, both the first P-channel MOS transistor 15 and the ninth P-channel MOS transistor 17 are turned on. The current amount of the discharge current is not limited by the ninth P-channel MOS transistor 17 when the discharge current is carried. Namely, by controlling the gate bias of the first P-channel MOS transistor 15, the drain current of the first P-channel MOS transistor 15 is controlled, and the current amount of the discharge current is also controlled.

Since other configurations are the same as those according to the first embodiment shown in FIG. 1, they will not be explained herein.

Operations performed by the oscillation-stop detection system configured as shown in FIG. 4 will be explained next. The operations in a stable state will be explained first with reference to FIG. 2, similarly to the first embodiment. As shown in FIG. 2, it is assumed as follows. At the time T1, the oscillation signal CK is stopped while the first N-channel MOS transistor 13 is turned off. At the time T2, an oscillation is started. At the time T3, the oscillation signal CK is stopped while the first N-channel MOS transistor 13 is turned off. At the time T4, the oscillation-stop detection circuit 1 detects that the oscillation is stopped. The operations at the respective times will be explained. It is assumed herein that the oscillation signal CK has the low voltage power supply potential VSS although the oscillation signal CK is not constant when the oscillation is stopped.

In the period from the time T1 to the time T2, the first capacitor 14 of the oscillation-stop detection circuit 1 is completely discharged. Therefore, the potential of the low voltage electrode of the first capacitor 14, i.e., the potential of the buffer input signal OSCST_NB is equal to the high voltage power supply potential VDD. The potential of the oscillation-stop detection signal OSCST is equal to the high voltage power supply potential VDD, accordingly. In the stable state, the reference potential PREF and the gate bias potential VREF are stable whether the oscillation circuit oscillates, and are potentials for turning on the ninth P-channel MOS transistor 17 and the first P-channel MOS transistor 15, respectively. In the stable state, therefore, the first P-channel MOS transistor 15 and the ninth P-channel MOS transistor 17 are always turned on. The regulated potential VREG is a potential obtained by adding the reference potential PREF and the gate bias potential VREF, and constant in the stable state whether the oscillation circuit oscillates.

An example of sizes of important elements of the oscillation-stop detection system, though not limited thereto, will be explained. A capacity of the first capacitor 14 is about 10 picofarads. The first P-channel MOS transistor 15 has a gate width of about 4 micrometers and a gate length of about 198 micrometers. The ninth P-channel MOS transistor 17 has a gate width of about 100 micrometers and a gate length of about 1 micrometer.

Since other configurations are the same as those according to the second embodiment shown in FIG. 2, they will not be explained herein.

Figure 5:
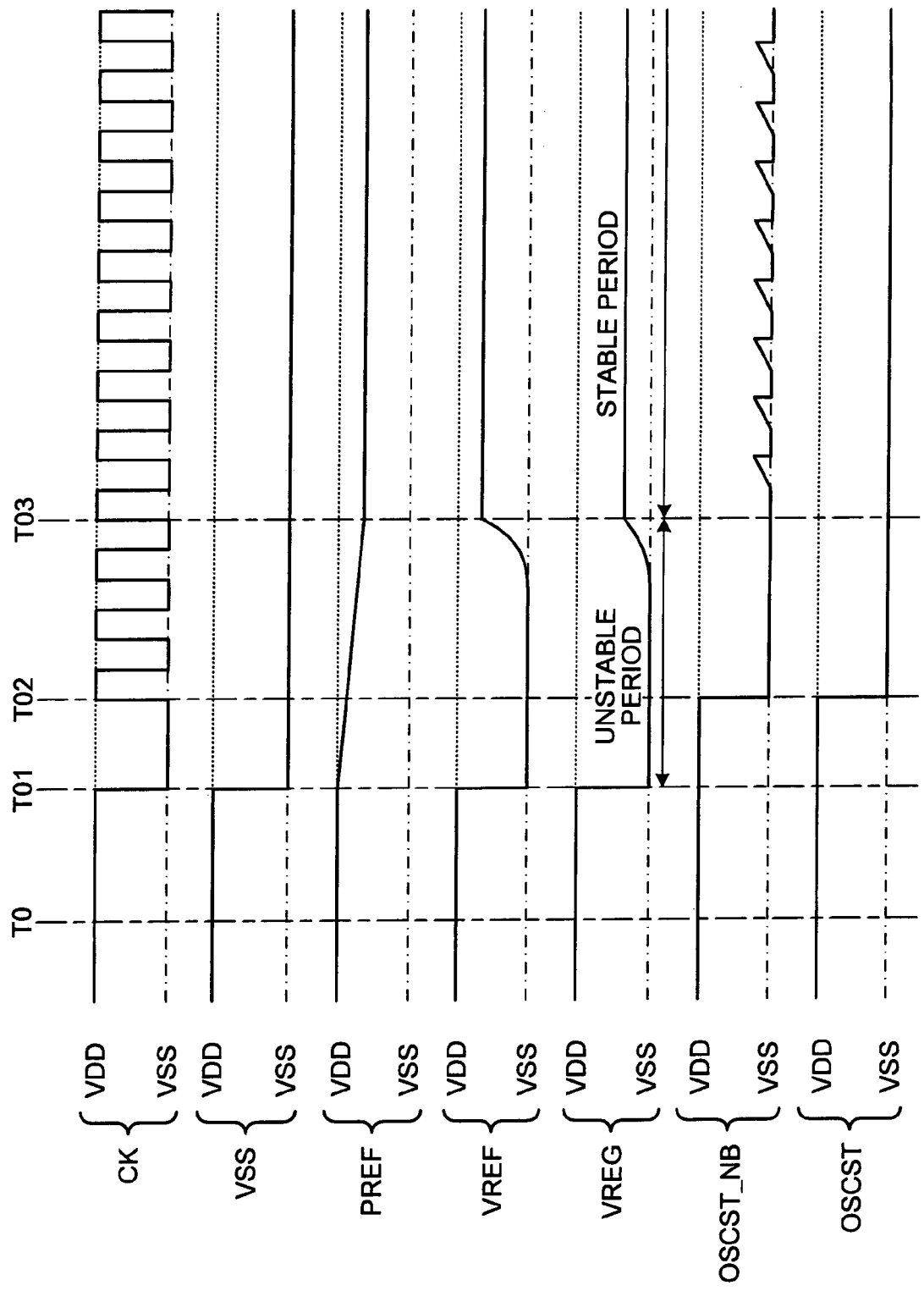

The operations performed by the oscillation-stop detection system configured as shown in FIG. 4 right after the power is turned on will be explained. FIG. 5 is a timing chart for explaining the operations. As shown in FIG. 5, it is assumed as follows. At a time T0, the power is not turned on. At a time T01, the power is turned on. At a time T02, an oscillation is started. At a time 03, the system is stabilized to the stable state. Subsequently, the oscillation is continued. The operations at the respective times will be explained.

In a period before the time T01 in which the power is not turned on, an applied potential of the input terminal of the oscillation signal CK, a potential of a wiring applied with the lower voltage power supply potential VSS, the reference potential PREF, the gate bias potential VREF, the regulated potential VREG, the potential of the buffer input signal OSCST_NB, and the potential of the oscillation-stop detection signal OSCST are all set at a grounding potential, i.e., the high voltage power supply potential. At the time T01, the power is turned on, whereby the applied potential of the input terminal of the oscillation signal CK and the potential of the wiring applied with the low voltage power supply potential VSS are switched to the low voltage power supply potential VSS. Thereafter, the potential of the wiring applied with the low voltage power supply potential VSS remains the low voltage power supply potential VSS until the power is turned off.

The reference potential PREF gradually falls from the high voltage power supply potential VDD right after the power is turned on. At the time T03, the reference potential PREF is stabilized to a potential dropped from the high voltage power supply potential VDD by as much as the potential difference between the high In an unstable period from the time T01 to the time T03, the reference potential PREF is a potential close to the high voltage power supply potential VDD. The ninth P-channel MOS transistor 17 of the oscillation-stop detection circuit 1 is, therefore, turned off.

The gate bias potential VREF temporarily falls down to a potential close to the low voltage power supply potential VSS when the power is turned on. At the time T03, the gate bias potential VREF is stabilized to a potential dropped from the high voltage power supply potential VDD by as much as the potential difference between the low voltage power supply potential VSS and the threshold of the N-channel MOS transistor. Even in the unstable period from the time T01 to the time T03, the gate bias potential VREF is lower than the threshold of the P-channel MOS transistor. The first P-channel MOS transistor 15 of the oscillation-stop detection circuit 1 is, therefore, turned on.

However, as explained above, since the ninth P-channel MOS transistor 17 is turned off, the oscillation is started at the time T02 in the unstable period. In addition, even if the first capacitor 14 of the oscillation-stop detection circuit 1 is charged, the discharge path for discharging the electric charge thus accumulated is cut off, so that the first capacitor 14 is not discharged. Following the start of the oscillation at the time T02, therefore, the respective potentials of the buffer input signal OSCST_NB and the oscillation-stop detection signal OSCST turn "L" level and remain "L" level until the time T03.

The regulated potential VREG changes similarly to the gate bias potential VREF. Right after the power is turned on at the time T01, the regulated potential VREG is a potential close to the low voltage power supply potential VSS. Thereafter, at the time T03, the regulated potential VREG is stabilized to a potential obtained by adding the potential difference between the high voltage power supply potential VDD and the threshold of the P-channel MOS transistor and the potential difference between the low voltage power supply potential VSS and the threshold of the N-channel MOS transistor to the negative side relative to the high voltage power supply potential VDD. In a stable period after the time T03, the oscillation-stop detection system operates in the stable state as explained above with reference to FIG. 2.

Figure 6:
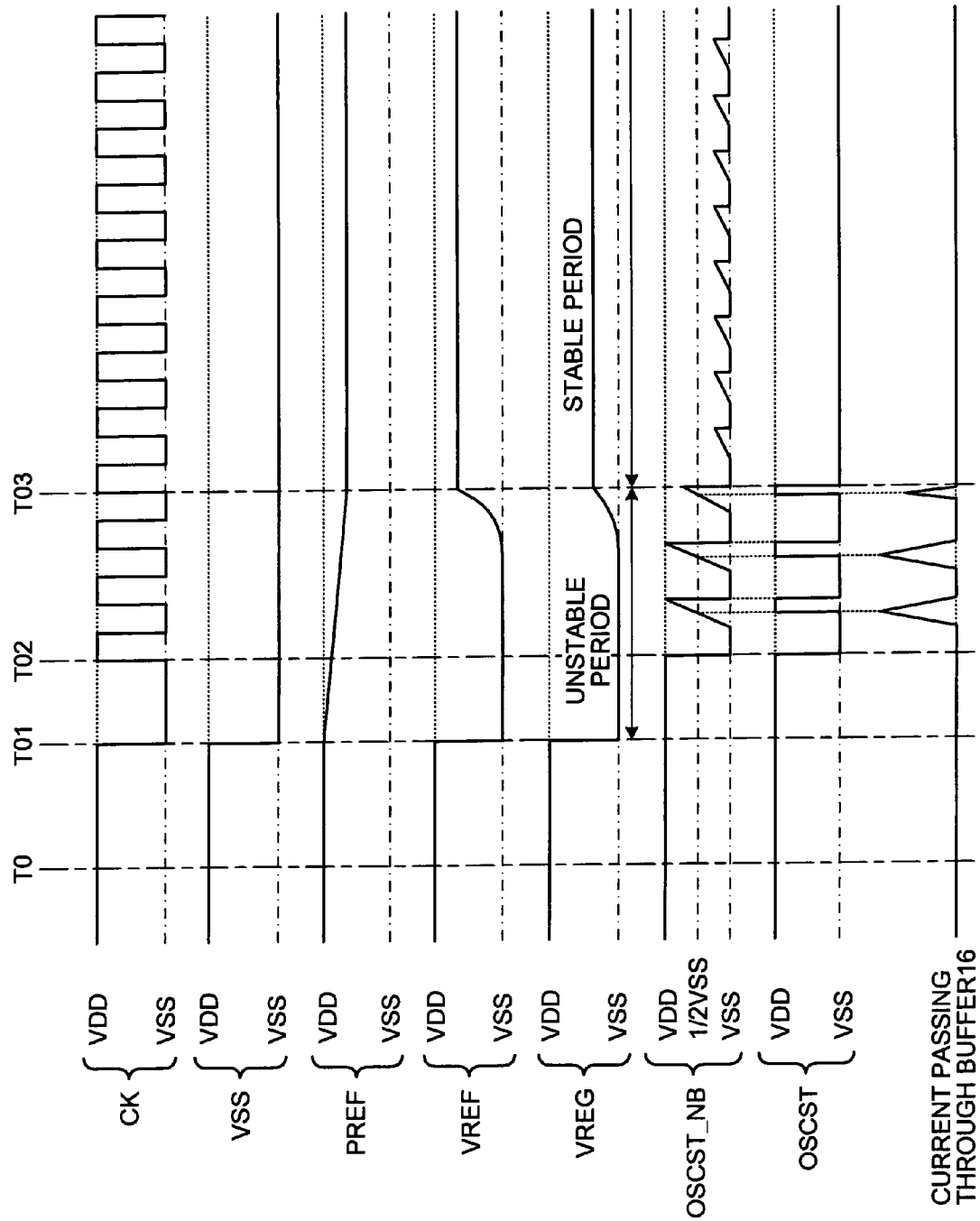

Provided that the oscillation-stop detection system does not include the ninth P-channel MOS transistor 17, the following problems occur in the unstable period between the time T01 and the time T03. As shown in FIG. 6, in the unstable period, the gate bias potential VREF is a potential close to the low voltage power supply potential VSS. Accordingly, when the oscillation is started at the time T02, the gate bias of the first P-channel MOS transistor 15 that serves as the discharge path increases and the drain current considerably increases, accordingly. If so, the discharge current is excessively carried. Accordingly, even if the oscillation is continued, the discharge of the first capacitor 14 is then completed between pulses of the oscillation signal CK, and the oscillation-stop detection circuit 1 erroneously detects that the oscillation is stopped. This problem continuously occurs in the unstable period.

Furthermore, when the discharge of the first capacitor 14 is completed between the pulses of the oscillation signal CK, the potential of the buffer input signal OSCST_NB exceeds the threshold of the buffer 16 (which is ½ VSS in FIG. 6). A through current is carried across the buffer 16, accordingly. This problem also continuously occurs in the unstable period, so that the current consumption is greatly increased. This problem is a serious disadvantage for the IC, e.g., the clock IC, required to realize a low current consumption. According to the second embodiment, by providing the ninth P-channel MOS transistor 17 and shutting off the discharge path of the first capacitor 14 in the unstable period, these problems can be avoided. Alternatively, the first P-channel MOS transistor 15 may be controlled to cut off the discharge path without using the ninth P-channel MOS transistor 17. In the alternative, since the first P-channel MOS transistor 15 cut off the discharge path, it is unnecessary to provide the ninth P-channel MOS transistor 17.

Figure 7:
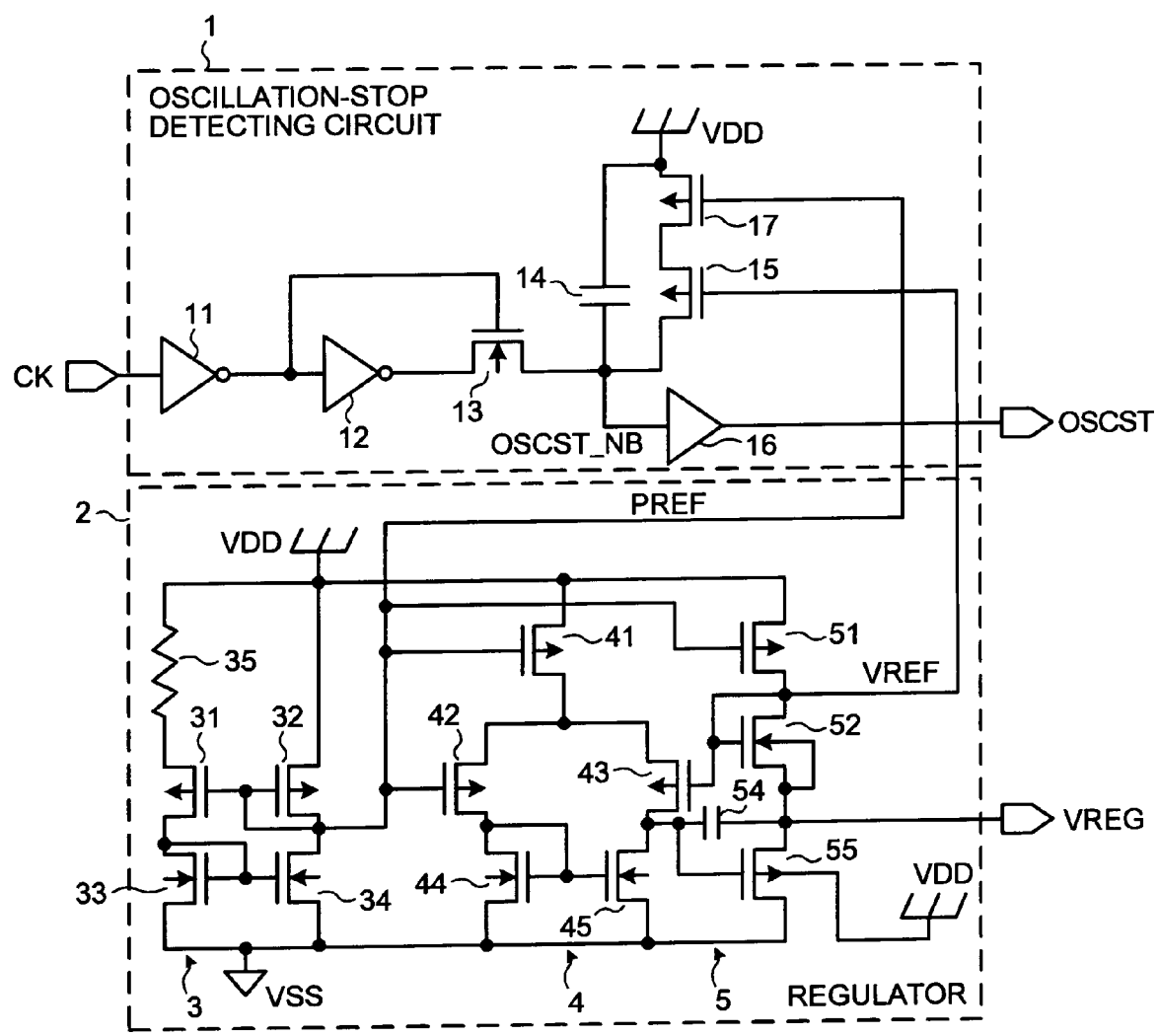
FIG. 7 is a circuit diagram of a modification of the second embodiment.

As shown in a modification of the second embodiment in FIG. 7, the eighth P-channel MOS transistor 55 may be employed as a source follower in the actuator of the output stage 5 of the regulator 2. If so, a gate terminal of the eighth P-channel MOS transistor 55 is connected to the drain terminal of the sixth P-channel MOS transistor 43 and one of the electrodes of the phase compensation second capacitor 54. A source terminal of the eighth P-channel MOS transistor 55 is connected to an output terminal of the regulated potential VREG, to the source terminal of the sixth N-channel MOS transistor 52, and to the other electrode of the second capacitor 54. The low voltage power supply potential VSS and the high voltage power supply potential VDD are applied to the drain terminal and the bulk of the eighth P-channel MOS transistor 55, respectively. Furthermore, the gate terminal of the fourth N-channel MOS transistor 44 is connected to the drain terminal of the fourth N-channel MOS transistor 44, the drain terminal of the fifth P-channel MOS transistor 42, and to the gate terminal of the fifth N-channel MOS transistor 45.

With the configuration shown in FIG. 7, in the eighth P-channel MOS transistor 55, a parasitic capacitance is generated between the gate and the bulk thereof. Therefore, even if the low voltage power supply potential VSS changes, the change is absorbed by the drain of the eighth P-channel MOS transistor 55. Accordingly, the regulated potential VREG is output from the output terminal of the regulated potential VREG without any influence of the change in the low voltage power supply potential VSS. Namely, it is possible to prevent the regulated potential VREG from changing. As long as the regulated potential VREG is constant, the gate bias potential VREF does not change, so that the stable gate bias potential VREF can be achieved. In other words, the stable oscillation stop detection time can be achieved.

According to the second embodiment, in the period after the power is turned on until the gate bias potential VREF of the first P-channel MOS transistor 15 serving as the discharge path is stabilized, no discharge current flows. Therefore, in the unstable transient period after the power is turned on until the system is turned into the stable state, it is possible to prevent an unfavorable operation such as an erroneous detection of the oscillation stop due to the temporary excessive flow of the discharge current although the oscillation is continued. Furthermore, in the stable state, while the oscillation is continued, the "L" level oscillation-stop detection signal OSCST is output from the oscillation-stop detection circuit 1. If the oscillation is stopped for the time longer than the predetermined oscillation stop detection time, the "H" level oscillation-stop detection signal OSCST is output from the oscillation-stop detection circuit 1. The oscillation-stop detection system can, therefore, accurately detect that the oscillation of the oscillation circuit is stopped.

Figure 8:
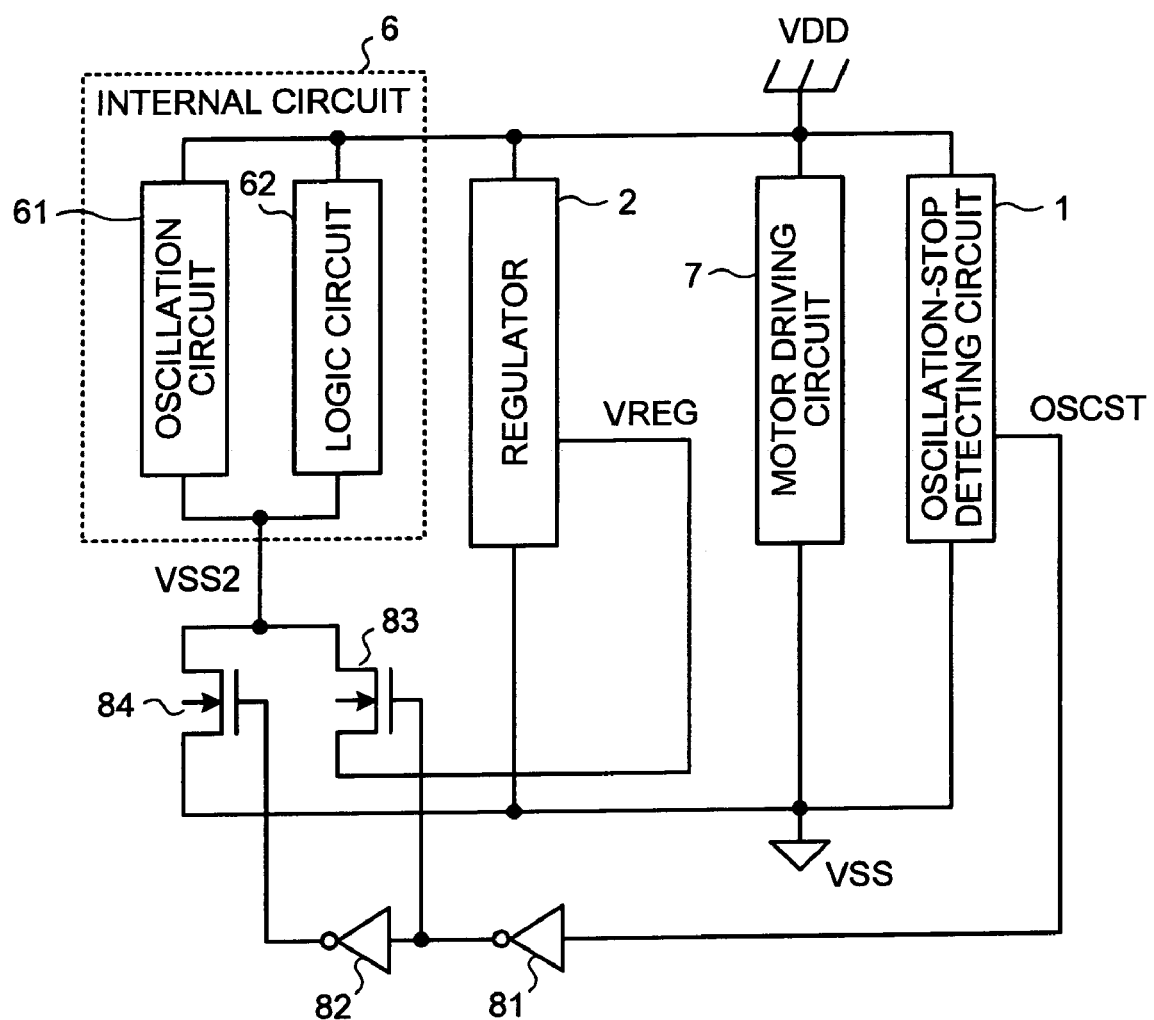
FIG. 8 is a block diagram of a schematic configuration of an electronic device according to a third embodiment of the present invention.

FIG. 8 is a block diagram of a schematic configuration of an electronic device according to a third embodiment of the present invention. A case that the electronic device is a clock, though not limited thereto, will be explained. It is assumed herein that the clock includes the oscillation-stop detection system according to the first or the second embodiment. The potential of the oscillation-stop detection signal OSCST output from the oscillation-stop detection circuit 1 is, therefore, at the "L" level while the oscillation is continued, and at the "H" level while the oscillation is stopped.

As shown in FIG. 8, the electronic device that is the clock includes, for example, the oscillation-stop detection circuit 1, the regulator 2, an internal circuit 6, a motor driving circuit 7, two inverters (third and fourth inverters) 81 and 82, and two N-channel MOS transistors (eighth and ninth N-channel MOS transistors) 83 and 84 that constitute switching elements, respectively. The internal circuit 6 includes an oscillation circuit 61 and a logic circuit 62. Although the clock includes various other circuit blocks, only typical blocks are shown in FIG. 8 and other ones are not shown therein.

The oscillation-stop detection circuit 1, the regulator 2, and the motor driving circuit 7 are driven by a power supply voltage configured by the high voltage power supply potential VDD and the low voltage power supply potential VSS. When the oscillation circuit 61 and the logic circuit 62 in the internal circuit 6 are operated normally, they are driven by a regulated voltage configured by the high voltage power supply potential VDD and the regulated potential VREG output from the regulator 2. If the oscillation of the oscillation circuit 61 is stopped, the power supply voltage configured by the high voltage power supply potential VDD and the low voltage power supply potential VSS is supplied to the oscillation circuit 61 and the logic circuit 62 so as to promptly start the oscillation.

The third inverter 81 inputs the oscillation-stop detection signal OSCST output from the oscillation-stop detection circuit 1, and outputs an inverted signal of the oscillation-stop detection signal OSCST. A signal output from the third inverter 81 is supplied to a gate terminal of the eighth N-channel MOS transistor 83. The regulated potential VREG output from the regulator 2 is applied to a source terminal of the eighth N-channel MOS transistor 83. A drain terminal of the eighth N-channel MOS transistor 83 is connected to low voltage power supply wirings of the oscillation circuit 61 and the logic circuit 62, respectively.

Therefore, while the eight N-channel MOS transistor 83 is turned on, the low voltage power supply potential (hereinafter, "internal circuit power supply potential VSS2") of each of the oscillation circuit 61 and the logic circuit 62 is equal to the regulated potential VREG.

The fourth inverter 82 inputs the output signal of the third inverter 81, and outputs an inverted signal of the output signal of the third inverter 81. A signal output from the fourth inverter 82 is supplied to a gate terminal of the ninth N-channel MOS transistor 84. The low voltage power supply potential VSS is applied to a source terminal of the ninth N-channel MOS transistor 84. A drain terminal of the ninth N-channel MOS transistor 84 is connected to the low voltage power supply wirings of the oscillation circuit 61 and the logic circuit 62, respectively. Therefore, while the ninth N-channel MOS transistor 84 is turned on, the internal circuit power supply potential VSS2 of each of the oscillation circuit 61 and the logic circuit 62 is equal to the low voltage power supply potential VSS.

Figure 9:
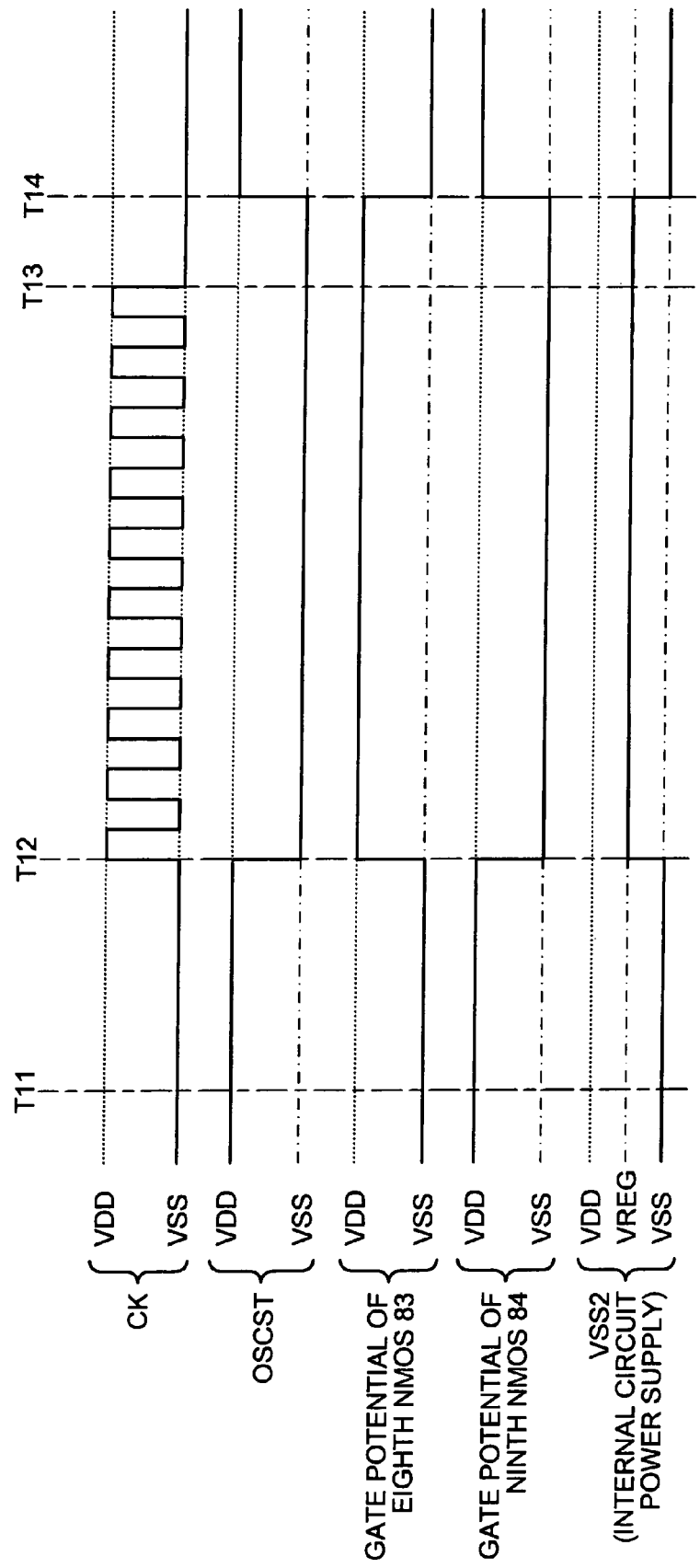
FIG. 9 is a timing chart for explaining operations of the electronic device shown in FIG. 8.

Operations performed by the electronic device configured as shown in FIG. 8 will be explained next. FIG. 9 is a timing chart for explaining the operations. As shown in FIG. 9, it is assumed as follows. At a time T11, the oscillation circuit 61 is stopped and the oscillation signal CK obtained by dividing a frequency of the output signal of the oscillation circuit 61 is, therefore, stopped. At a time T12, the oscillation of the oscillation circuit 61 is started to thereby supply the oscillation signal CK. At a time T13, the oscillation of the oscillation circuit 61 is stopped and the oscillation signal CK is stopped. At a time T14, the oscillation-stop detection circuit 1 detects that the oscillation is stopped. The operations at the respective times will be explained. If the operation timings of the electronic device are tuned to those of the oscillation-stop detection system according to the first embodiment, the times T11, T12, T13, and T14 according to the third embodiment correspond to the times T1, T2, T3, and T4 according to the first embodiment, respectively.

In a period from the time T11 to the time T12, the oscillation signal CK is stopped. The potential of the oscillation-stop detection signal OSCST output from the oscillation-stop detection circuit 1 is, therefore, equal to the high voltage power supply potential VDD. If so, a gate potential of the eighth N-channel MOS transistor 83 is equal to the low voltage power supply potential VSS, and the eighth N-channel MOS transistor 83 is, therefore, turned off. On the other hand, since a gate potential of the ninth N-channel MOS transistor 84 is equal to the high voltage power supply potential VDD, the ninth N-channel MOS transistor 84 is turned on. Accordingly, the low voltage power supply potential VSS is applied to the oscillation circuit 61 and the logic circuit 62 through the ninth N-channel MOS transistor 84, so that the internal circuit power supply potential VSS2 is equal to the low voltage power supply potential VSS.

At the time T12, the potential of the oscillation-stop detection signal OSCST is switched from the high voltage power supply potential VDD to the low voltage power supply potential VSS in response to the start of the oscillation. Accordingly, the gate potential of the eighth N-channel MOS transistor 83 is switched from the low voltage power supply potential VSS to the high voltage power supply potential VDD, and the eighth N-channel MOS transistor 83 is turned on. The gate potential of the ninth N-channel MOS transistor 84 is switched from the high voltage power supply potential VDD to the low voltage power supply potential VSS, and the ninth N-channel MOS transistor 84 is, therefore, turned off.

In a period from the time T12 to the time T13, the potential of the oscillation-stop detection signal OSCST remains the low voltage power supply potential VSS. The eighth N-channel MOS transistor 83 is, therefore, kept to be turned on. Since the ninth N-channel MOS transistor 84 is kept to be turned off, the regulated potential VREG is applied to the oscillation circuit 61 and the logic circuit 62 through the eighth N-channel MOS transistor 83. The internal circuit power supply potential VSS2 is, therefore, equal to the regulated potential VREG.

Even if the oscillation is stopped at the time T13, the potential of the oscillation-stop detection signal OSCST, the gate potential of the eighth N-channel MOS transistor 83, and the gate potential of the ninth N-channel MOS transistor 84 do not change until the oscillation-stop detection circuit 1 detects that the oscillation is stopped at the time T14. The internal circuit power supply potential VSS2, therefore, remains the regulated potential VREG.

When the oscillation-stop detection circuit 1 detects that the oscillation is stopped at the time T14, the potential of the oscillation-stop detection signal OSCST is switched from the low voltage power supply potential VSS to the high voltage power supply potential VDD. The eighth N-channel MOS transistor 83 is turned off and the ninth N-channel MOS transistor 84 is turned on, accordingly. Therefore, the low voltage power supply potential VSS is applied to the oscillation circuit 61 and the logic circuit 62, so that the internal circuit power supply potential VSS2 is switched to the low voltage power supply potential VSS. Before the oscillation is resumed, the internal circuit power supply potential VSS2 remains the low voltage power supply potential VSS.

Figure 10:
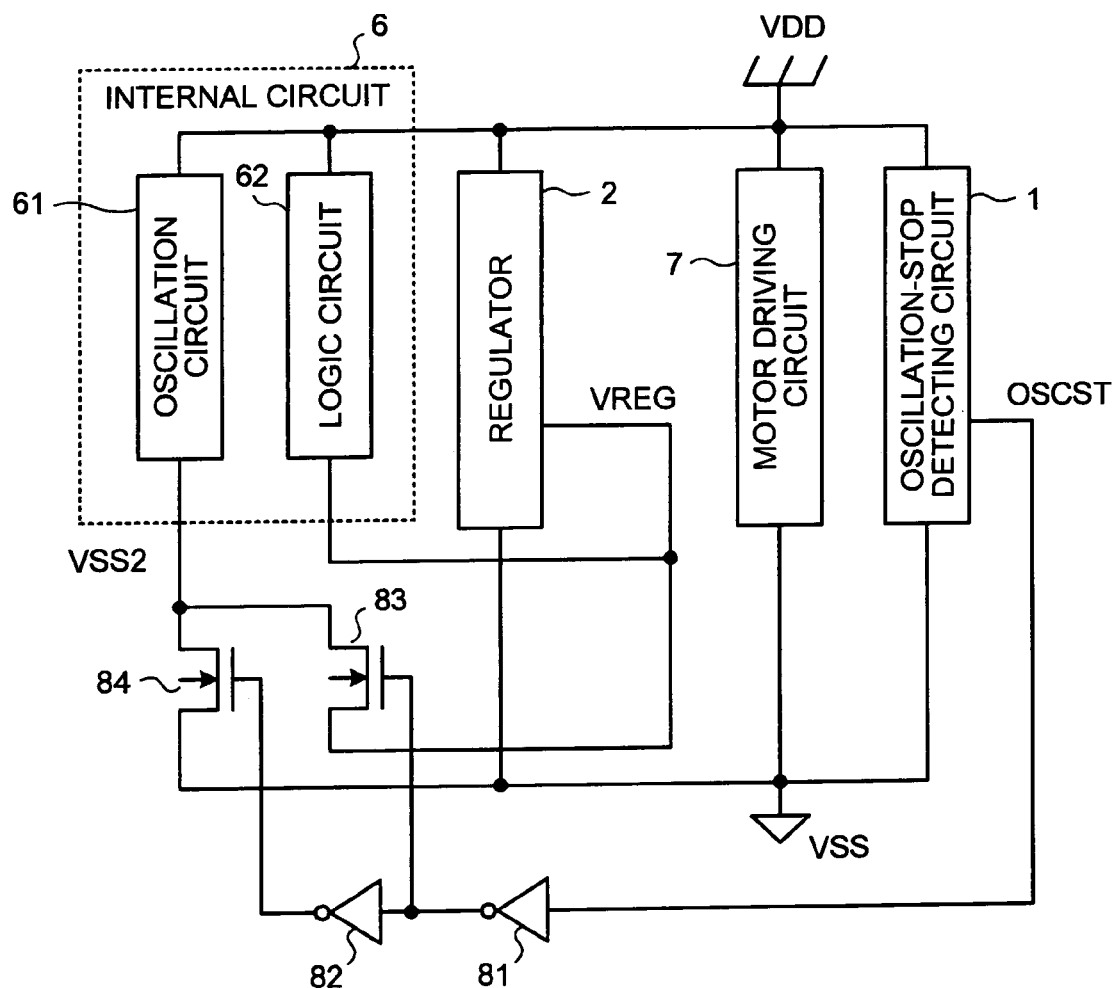
FIG. 10 is a circuit diagram of a modification of the third embodiment.
Figure 11:
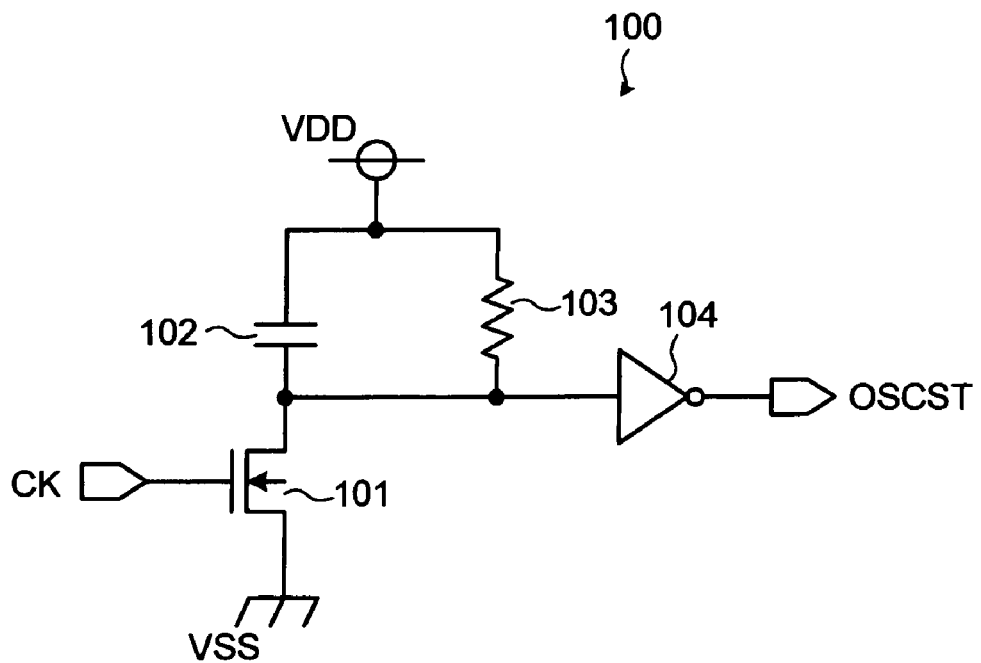
FIG. 11 is a circuit diagram of a configuration of a conventional oscillation detecting circuit.
Figure 12:
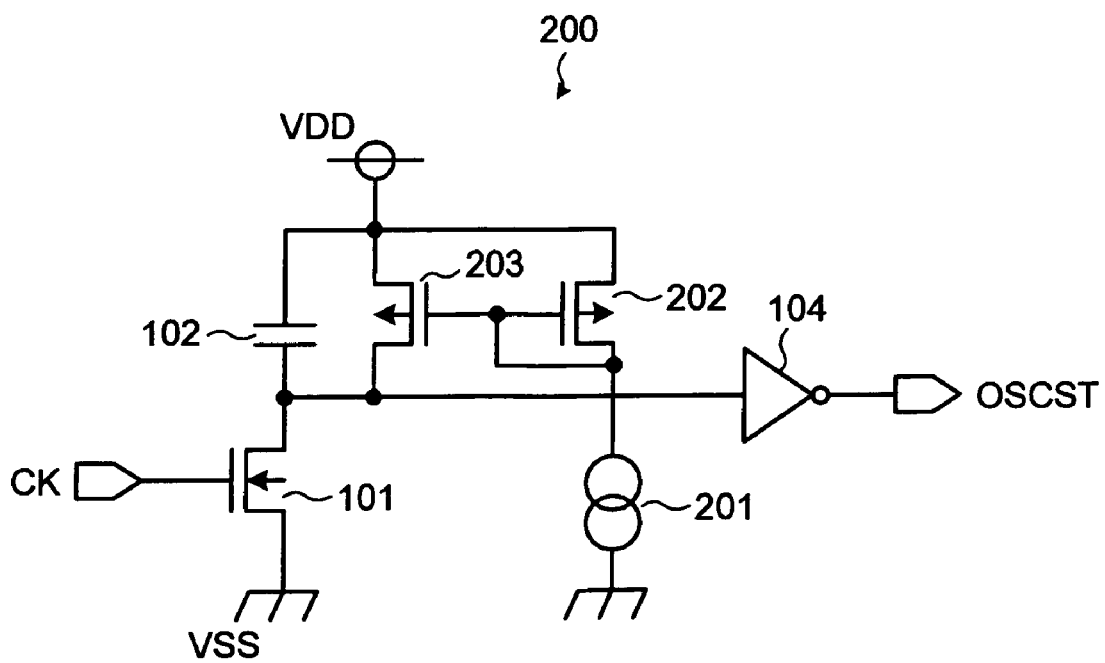
FIG. 12 is a circuit diagram of a configuration of another conventional oscillation detecting circuit.

In the internal circuit 6, the logic circuit 62 may be constituted to be driven by the power supply potential configured by the high voltage power supply potential VDD and the low voltage power supply potential VSS or the power supply potential configured by the high voltage power supply potential VDD and the regulated potential VREG whether the oscillation is present. Namely, as shown in a modification of the third embodiment in FIG. 10, the internal circuit 6 may be constituted as follows. Only the oscillation circuit 61 is driven by a regulated voltage configured by the high voltage power supply potential VDD and the regulated potential VREG in normal operation, and driven by the power supply voltage configured by the high voltage power supply potential VDD and the low voltage power supply potential VSS at the resumption of the oscillation. If so, the regulated potential VREG is applied to a low voltage power supply wiring of the logic circuit 62, and the drain terminal of the eighth N-channel MOS transistor 83 is connected to a low voltage power supply wiring of the oscillation circuit 61.

According to the third embodiment, while the oscillation circuit 61 oscillates, the oscillation circuit 61 and the logic circuit 62 are driven by the regulated voltage configured by the high voltage power supply potential VDD and the regulated potential VREG. In addition, when the oscillation is stopped, the oscillation circuit 61 is driven by the power supply voltage configured by the high voltage power supply potential VDD and the low voltage power supply potential VSS. It is, therefore, possible to realize low current consumption and to promptly resume the oscillation of the oscillation circuit 61. It is also possible to prevent the oscillation-stop detection circuit 1 from erroneously detecting that the oscillation of the oscillation circuit 61 is stopped in the unstable period right after the power is turned on.

Furthermore, for reasons to be explained next, the oscillation-stop detection circuit 1 can accurately detect that the oscillation of the oscillation circuit 61 is stopped, thereby making it possible to ensure resuming the oscillation.

Provided that the electronic device does not include the eight N-channel MOS transistor 83 and the ninth N-channel MOS transistor 84, and that the regulated potential VREG is set at the low voltage power supply potential VSS during resumption of the oscillation, for example, a short-circuit switching element is provided in parallel to the actuator of the regulator 2 and the regulated potential VREG is forced to be set at the low voltage power supply potential VSS by operating the short-circuit switching element, the following problems occur. If the regulated potential VREG is short-circuited to the low voltage power supply potential VSS, the gate bias potential VREF (see FIG. 1) output from the oscillation-stop detection circuit 1 changes toward the low voltage power supply potential VSS.

If so, the gate potential of the first P-channel MOS transistor 15 of the oscillation-stop detection circuit 1 is close to the low voltage power supply potential VSS, and the drain current for the first P-channel MOS transistor 15, i.e., the discharge current for the first capacitor 14 is excessively carried. Accordingly, although the oscillation circuit 61 oscillates, the oscillation-stop detection circuit 1 may possibly erroneously detect that the oscillation of the oscillation circuit 61 is stopped. According to the third embodiment, by contrast, the regulated potential VREG is not short-circuited to the low voltage power supply potential VSS. Therefore, the gate bias potential VREF is stable and the oscillation-stop detection circuit 1 can accurately detect that the oscillation of the oscillation circuit 61 is stopped.

The present invention is not limited to the embodiments explained so far, and various changes and modifications can be made to the present invention. For example, in the first embodiment, a constant voltage may be applied from another constant-voltage source to the gate terminal of the first P-channel MOS transistor 15 instead of fetching the gate bias of the first P-channel MOS transistor 15 of the oscillation-stop detection circuit 1 from the regulator 2. In addition, the detecting unit is not limited to the buffer 16, but may be constituted differently from the buffer 16. For example, the detecting unit can be constituted using an inverter.

Furthermore, in the second embodiment, constant voltages may be applied to the gate terminal of the first P-channel MOS transistor 15 and that of the ninth P-channel MOS transistor 17 from another constant-voltage source instead of fetching the respective gate biases of the first P-channel MOS transistor 15 and the ninth P-channel MOS transistor 17 of the oscillation-stop detection circuit 1 from the regulator 2. In addition, the detecting unit is not limited to the buffer 16, but may be constituted differently from the buffer 16. For example, the detecting unit can be constituted using an inverter.

The oscillation-stop detection circuit, the oscillation-stop detection system, or the oscillation-stop detection method according to the present invention exhibits advantages in that it is possible to prevent the erroneous operation in the unstable period right after the power is turned on and to accurately detect that the oscillation of the oscillation circuit is stopped. In addition, the electronic device according to the present invention exhibits advantages in that it is possible to accurately and promptly resume the oscillation by preventing the erroneous operation in the unstable period right after the power is turned on and accurately detecting that the oscillation of the oscillation circuit is stopped.

The present document incorporates by reference the entire contents of Japanese priority documents, 2004-063038 filed in Japan on Mar. 5, 2004 and Japanese priority documents, 2004-064397 filed in Japan on Mar. 8, 2004.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An oscillation-stop detection circuit comprising:
  a switching unit that repeats turning on and off based on a cycle of an oscillation signal from an outside;
  a capacitor that is charged when the switching unit is turned on, and discharged when the switching unit is turned off;
  a first MOS transistor that flows a discharge current of the capacitor;
  a discharge cutoff unit that cuts off a discharge path for the discharge current, for a predetermined time right after a power is turned on; and
  a detection unit that detects a status of the oscillation signal based on a voltage of the capacitor.

2. The oscillation-stop detection circuit according to claim 1, wherein the discharge cutoff unit cuts off the discharge path, when the power is turned on, until a gate bias of the first MOS transistor is stabilized.

3. The oscillation-stop detection circuit according to claim 1, wherein
  the discharge cutoff unit is a second MOS transistor that is connected to the first MOS transistor in series, and
  a ratio of a gate width to a gate length of the second MOS transistor is sufficiently larger than that of the first MOS transistor, or an
  ON resistance of the second MOS transistor is sufficiently smaller than that of the first MOS transistor.

4. An oscillation-stop detection system comprising:
  an oscillation-stop detection circuit that includes
    a switching unit that repeats turning on and off based on a cycle of an oscillation signal from an outside;
    a capacitor that is charged when the switching unit is turned on, and discharged when the switching unit is turned off;
    a first MOS transistor that flows a discharge current of the capacitor;
    a discharge cutoff unit that cuts off a discharge path for the discharge current, for a predetermined time right after a power is turned on; and
    a detection unit that detects a status of the oscillation signal based on a voltage of the capacitor; and
  a constant-voltage source that applies a gate bias of a constant potential to a gate of the first MOS transistor.

5. The oscillation-stop detection system according to claim 4, wherein the discharge cutoff unit cuts off the discharge, when the power is turned on, until a gate bias of the first MOS transistor is stabilized.

6. The oscillation-stop detection system according to claim 4, wherein
  the discharge cutoff unit is a second MOS transistor that is connected to the first MOS transistor in series, and
  a ratio of a gate width to a gate length of the second MOS transistor is sufficiently larger than a ratio of a gate width to a gate length of the first MOS transistor, or an ON resistance of the second MOS transistor is sufficiently smaller than an ON resistance of the first MOS transistor.

7. The oscillation-stop detection system according to claim 6, wherein the constant-voltage source applies a gate bias of a constant potential to a gate of the second MOS transistor.

8. The oscillation-stop detection system according to claim 7, wherein
the constant-voltage source includes a regulator that includes
a reference circuit that generates a predetermined reference potential based on a power supply voltage supplied from the outside;
a potential generation circuit that generates a positive predetermined potential; and
an operational amplifier that includes a negative input terminal to which the reference potential from the reference circuit is input, a positive input terminal to which the positive predetermined potential is input, and an output terminal from which a regulated potential is output,
the positive predetermined potential is applied to the gate of the first MOS transistor, and
the reference potential is applied to the gate of the second MOS transistor.

9. The oscillation-stop detection system according to claim 8, wherein
the reference circuit outputs, as the reference potential, a potential dropped from a high voltage power supply potential by a potential difference between the high voltage power supply potential and a threshold of a P-channel MOS transistor, and
the potential generation circuit outputs, as the positive predetermined potential, a potential dropped from the high voltage power supply potential by a potential difference between a low voltage power supply potential and a threshold of an N-channel MOS transistor.

10. The oscillation-stop detection system according to claim 8, wherein the regulator includes a source follower formed with a P-channel MOS transistor between an output terminal from which the regulated potential is output and a low potential power-supply-potential-apply point, as an actuator of an output stage.

11. The oscillation-stop detection system according to claim 6, further comprising a second constant-voltage source that applies a gate bias having a constant potential to a gate of the second MOS transistor.

12. An oscillation-stop detection system comprising:
an oscillation-stop detection circuit that includes
a switching unit that repeats turning on and off based on a cycle of an oscillation signal from an outside;
a capacitor that is charged when the switching unit is turned on, and discharged when the switching unit is turned off;
a MOS transistor that flows a discharge current of the capacitor when the capacitor is discharged; and
a detection unit that detects a status of the oscillation signal based on a voltage of the capacitor; and
a constant-voltage source that applies a gate bias of a constant potential to a gate of the MOS transistor,
wherein
the constant-voltage source includes a regulator that includes
a reference circuit that generates a predetermined reference potential based on a power supply voltage supplied from the outside;
a potential generation circuit that generates a positive predetermined potential; and
an operational amplifier that includes a negative input terminal to which the reference potential from the reference circuit is input, a positive input terminal to which the positive predetermined potential is input, and an output terminal from which a regulated potential is output, and
the positive predetermined potential is applied to the gate of the MOS transistor.

13. The oscillation-stop detection system according to claim 12, wherein
the reference circuit outputs, as the reference potential, a potential dropped from a high voltage power supply potential by a potential difference between the high voltage power supply potential and a threshold of a P-channel MOS transistor, and
the potential generation circuit outputs, as the positive predetermined potential, a potential dropped from the high voltage power supply potential by a potential difference between a low voltage power supply potential and a threshold of an N-channel MOS transistor.

14. The oscillation-stop detection system according to claim 12, wherein the regulator includes a source follower formed with a P-channel MOS transistor between an output terminal from which the regulated potential is output and a low potential power-supply-potential-apply point, as an actuator of an output stage.

15. An electronic device comprising:
an oscillation circuit that outputs an oscillation signal;
an oscillation-stop detection circuit that detects a status of the oscillation, and that outputs an oscillation-stop detection signal upon detecting that the oscillation is stopped;
a regulator that drops a power supply potential to output a regulated voltage having a constant potential; and
a switching unit that switches a voltage applied to the oscillation circuit between the regulated voltage and the power supply voltage, based on the oscillation-stop detection signal.

16. The electronic device according to claim 15, wherein the switching unit includes
a first switching element that is turned on when a potential of the oscillation-stop detection signal is a first potential and applies the regulated voltage to the oscillation circuit, and that is turned off when the potential of the oscillation-stop detection signal is a second potential; and
a second switching element that is turned on when the potential of the oscillation-stop detection signal is the second potential and applies the power supply voltage to the oscillation circuit, and that is turned off when the potential of the oscillation-stop detection signal is the first potential.

17. The electronic device according to claim 15, further comprising a logic circuit, wherein
the switching unit switches a voltage applied to the logic circuit between the regulated voltage and the power supply voltage, based on the oscillation-stop detection signal.

18. The electronic device according to claim 17, wherein the switching unit includes
a first switching element that is turned on when a potential of the oscillation-stop detection signal is a first potential and applies the regulated voltage to the oscillation circuit and the logic circuit, and that is turned off when the potential of the oscillation-stop detection signal is a second potential; and a second switching element that is turned on when the potential of the oscillation-stop detection signal is the second potential and applies the power supply voltage to the oscillation circuit and the logic circuit, and that is turned off when the potential of the oscillation-stop detection signal is the first potential.

19. The electronic device according to claim 16, wherein each of the first switching element and the second switching element is formed with a MOS transistor that is turned on and off based on the oscillation-stop detection signal.

20. The electronic device according to claim 15, wherein the oscillation-stop detection circuit includes
a switching unit that repeats turning on and off based on a cycle of an oscillation signal from an outside;
a capacitor that is charged when the switching unit is turned on, and discharged when the switching unit is turned off;
a MOS transistor that flows a discharge current of the capacitor when the capacitor is discharged; and
a detection unit that detects a status of the oscillation signal based on a voltage of the capacitor; and
a constant-voltage source that applies a gate bias of a constant potential to a gate of the MOS transistor, and
the regulator includes
a reference circuit that generates a predetermined reference potential based on a power supply voltage supplied from the outside;
a potential generation circuit that generates a positive predetermined potential; and
an operational amplifier that includes a negative input terminal to which the reference potential from the reference circuit is input, a positive input terminal to which the positive predetermined potential is input, and an output terminal from which a regulated potential is output, and
the positive predetermined potential is applied to the gate of the MOS transistor.

21. An electronic device comprising:
an oscillation circuit that outputs an oscillation signal;
an oscillation-stop detection circuit that includes
a first switching unit that repeats turning on and off based on a cycle of the oscillation signal;
a capacitor that is charged when the first switching unit is turned on, and discharged when the first switching unit is turned off;
a first MOS transistor that flows a discharge current of the capacitor;
a second MOS transistor that cuts off a discharge path for the discharge current, for a predetermined time right after a power is turned on; and
a detection unit that detects a status of the oscillation signal based on a voltage of the capacitor;
a regulator that includes
a reference circuit that generates a predetermined reference potential based on a power supply voltage;
a potential generation circuit that generates a positive predetermined potential; and
an operational amplifier that includes a negative input terminal to which the reference potential from the reference circuit is input, a positive input terminal to which the positive predetermined potential is input, and an output terminal from which a regulated potential is output, the regulator applying the positive predetermined potential to a gate of the first MOS transistor and the reference potential to a gate of the second MOS transistor; and
a second switching unit that switches a voltage applied to the oscillation circuit between the regulated voltage and the power supply voltage based on the oscillation-stop detection signal.

22. The electronic device according to claim 21, wherein the second MOS transistor cuts off the discharge path, when the power is turned on, until a gate bias of the first MOS transistor is stabilized.

23. The electronic device according to claim 21, wherein
the second MOS transistor is connected to the first MOS transistor in series, and
a ratio of a gate width to a gate length of the second MOS transistor is sufficiently larger than a ratio of a gate width to a gate length of the first MOS transistor, or an ON resistance of the second MOS transistor is sufficiently smaller than an ON resistance of the first MOS transistor.

24. The electronic device according to claim 21, wherein the switching unit includes
a first switching element that is turned on when a potential of the oscillation-stop detection signal is a first potential and applies the regulated voltage to the oscillation circuit, and that is turned off when the potential of the oscillation-stop detection signal is a second potential; and
a second switching element that is turned on when the potential of the oscillation-stop detection signal is the second potential and applies the power supply voltage to the oscillation circuit, and that is turned off when the potential of the oscillation-stop detection signal is the first potential.

25. The electronic device according to claim 24, wherein each of the first switching element and the second switching element is formed with a MOS transistor that repeats turning on and off based on the oscillation-stop detection signal.

26. An oscillation-stop detection method comprising:
cutting off a discharge path for a discharge current when a capacitor is discharged, for a predetermined time right after a power is turned on;
charging the capacitor based on a cycle of an oscillation signal;
discharging an electric charge of the capacitor at a constant amount of current; and
detecting a status of the oscillation signal based on a voltage of the capacitor.

* * * * *